US006788536B2

(12) United States Patent
Lai et al.

(10) Patent No.: US 6,788,536 B2
(45) Date of Patent: Sep. 7, 2004

(54) FAN HOLDER FOR HEAT SINK

(75) Inventors: Cheng-Tien Lai, Tu-chen (TW); Shenghua Wang, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 12 days.

(21) Appl. No.: 10/361,812

(22) Filed: Feb. 10, 2003

(65) Prior Publication Data

US 2004/0008488 A1 Jan. 15, 2004

(30) Foreign Application Priority Data

Jul. 10, 2002 (TW) ........................................ 91210503 U

(51) Int. Cl.[7] ................................................ H05K 7/20
(52) U.S. Cl. ....................... 361/697; 165/80.3; 165/121; 165/185; 361/695; 361/703; 257/722; 415/177; 415/178
(58) Field of Search ........................... 24/453; 165/80.3; 257/722; 248/505, 510; 415/177, 178, 213.1, 214.1; 361/687, 694–695, 697, 764, 767, 710, 703

(56) References Cited

U.S. PATENT DOCUMENTS 6,392,885 B1 * 5/2002 Lee et al. .................... 361/697
6,496,368 B2 * 12/2002 Jui-Yuan ..................... 361/697
6,520,250 B2 * 2/2003 Lee et al. .................... 165/121

* cited by examiner

*Primary Examiner*—Gregory D. Thompson
(74) *Attorney, Agent, or Firm*—Wei Te Chung

(57) ABSTRACT

A fan holder (10) for mounting a fan (30) to a heat sink (20) includes a rectangular base (12). The base is attached to the heat sink, and supports the fan thereon. An opening (14) is defined in the base, for providing airflow access from the fan to the heat sink. A pair of tabs (16) depends from each of opposite sides of the base. Each pair of tabs is disposed at respective opposite ends of the respective side of the base. A stop (161) integrally extends from each tab, the stop engaging in a corresponding slot of the heat sink. A handle (163) integrally extends from each tab, for facilitating manual operation whereby the tab is moved resiliently. In a preferred embodiment, each stop is orthogonal to both the tab and the base. In an alternative embodiment, each stop is orthogonal to the tab and parallel to the base.

20 Claims, 4 Drawing Sheets

FAN HOLDER FOR HEAT SINK

BACKGROUND OF THE INVENTION

1. Field of the Invention

The present invention relates to fan holders attached to heat sinks, and more particularly to a fan holder conveniently securing a fan on top of a heat sink.

2. Description of Related Art

Numerous modem electronic devices such as central processing units (CPUs) of computers generate large amounts of heat during operation. The heat must be efficiently removed from the CPU; otherwise, abnormal operation or damage may result. Typically, a heat sink is attached on the CPU to remove heat therefrom. A fan is mounted on top of the heat sink to enhance heat dissipation efficiency.

The fan commonly defines four through holes in four corners of a frame thereof. Four screws are inserted through the through holes of the frame and engaged with fins of the heat sink, thereby securing the fan to the heat sink. However, the fins of the heat sink are normally relatively thin, and are prone to be deformed or damaged when the screws are engaged therewith. When this happens, the screws are easily loosened or even disengaged from the fins. When the fan is no longer securely mounted on the heat sink the fan may operate less efficiently and cause noise.

A variety of fan holders have been developed for mounting a fan to a heat sink. One example is disclosed in China Pat. No. 01215736.8. The fan holder comprises a rectangular base, a pair of hooks, and four pins. The hooks engage in notches of the heat sink at opposite ends of fins of the heat sink thereby fastening the fan holder to the heat sink. The fan is pressed onto the fan holder. The pins are received in through holes of a frame of the fan. The fan is thereby securely mounted on top of the heat sink. However, tools are required to detach the fan holder from the heat sink. This is unduly inconvenient.

SUMMARY OF THE INVENTION

Accordingly, an object of the present invention is to provide a fan holder for easily and securely mounting a fan to a heat sink.

In order to achieve the object set out above, a fan holder for mounting a fan to a heat sink in accordance with a preferred embodiment of the present invention comprises a rectangular base. The base is attached to the heat sink, and supports the fan thereon. An opening is defined in a middle of the base, for providing airflow access from the fan to the heat sink. A pair of tabs depends from each of opposite sides of the base. Each pair of tabs is disposed at respective opposite ends of the respective side of the base. A stop integrally extends from each tab, the stop engaging in a corresponding slot of the heat sink. A handle integrally extends from each tab, for facilitating manual operation whereby the tab is moved resiliently. In the preferred embodiment, each stop is orthogonal to both the tab and the base. In an alternative embodiment, each stop is orthogonal to the tab and parallel to the base.

Other objects, advantages and novel features of the present invention will become more apparent from the following detailed description when taken in conjunction with the accompanying drawings, in which:

DETAILED DESCRIPTION OF THE INVENTION

Figure 1:
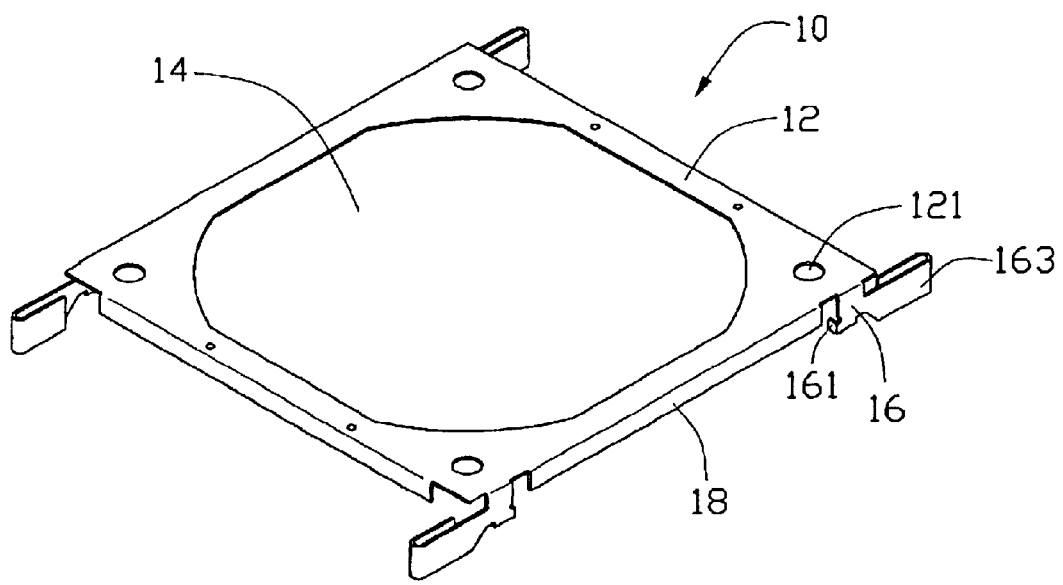
FIG. 1 is an isometric view of a fan holder in accordance with a preferred embodiment of the present invention.
Figure 2:
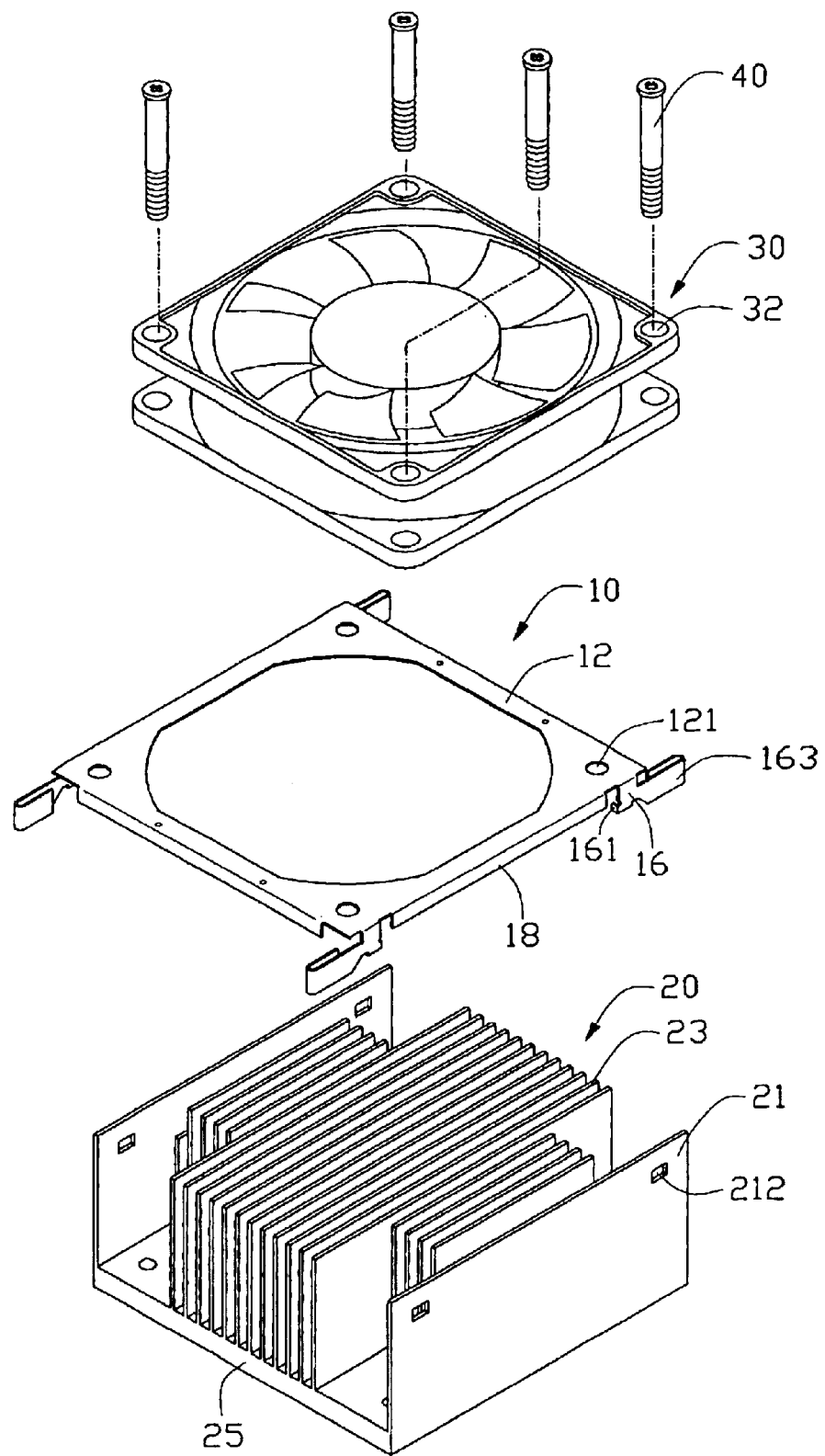
FIG. 2 is an exploded, isometric view of the fan holder of FIG. 1, together with a fan, four screws and a heat sink.

FIG. 1 shows a fan holder 10 in accordance with a preferred embodiment of the present invention. Referring also to FIG. 2, the fan holder 10 is for mounting a fan 30 to a heat sink 20.

The fan 30 defines four through holes 32 in four corners thereof, for insertion of four screws 40 therethrough. The heat sink 20 comprises a chassis 25, a plurality of parallel fins 23 extending upwardly from the chassis 25, and a pair of blocking plates 21 extending upwardly from respective opposite sides of the chassis 25 at respective opposite sides of the plurality of fins 23. Each blocking plate 21 defines a pair of slots 212 in upper corners thereof respectively.

The fan holder 10 is integrally formed and comprises a rectangular base 12 for attachment to a top of the heat sink 20. An opening 14 is defined in a middle of the base 12, for providing airflow access from the fan 30 to the heat sink 20. Four screw holes 121 are respectively defined in four corners of the base 12, for the insertion of the screws 40 therethrough. Four flanges 18 respectively depend from four edges of the base 12. The flanges 18 fittingly receive a top portion of the heat sink 20 therebetween, for preventing the fan holder 10 from shifting in a horizontal plane relative to the heat sink 20. A pair of tabs 16 depends from each of opposite sides of the base 12. Each pair of tabs 16 is disposed at opposite ends respectively of the respective side of the base 12. A stop 161 inwardly extends from an inner edge of each tab 16, the stop 161 being orthogonal to both the tab 16 and the base 12. The stops 161 are receivable in the slots 212 of the heat sink 20, to secure the fan holder 10 to the heat sink 20. A handle 163 extends generally coplanarly from an outer edge of each tab 16. The handle 163 is bent so that it doubles back over itself, and thereby can facilitate manual operation of the tab 16.

Figure 3:
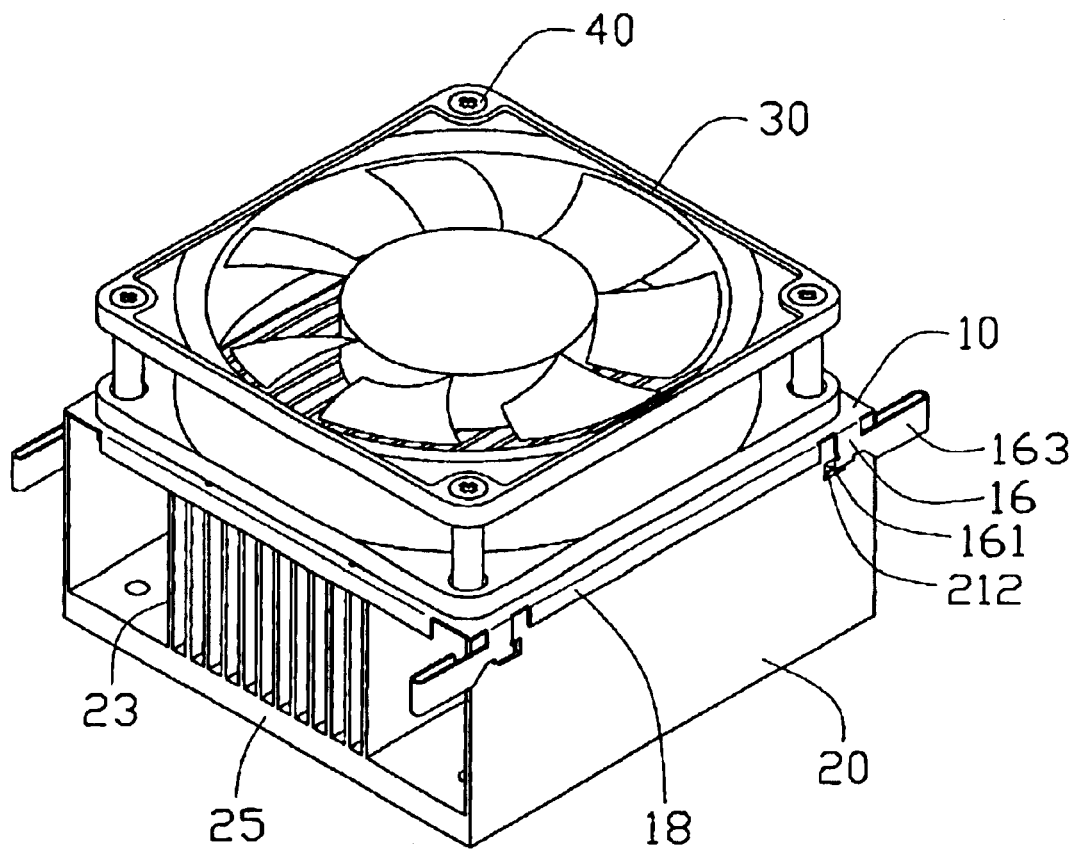
FIG. 3 is an assembled view of FIG. 2.

Referring also to FIG. 3, in use of the fan holder 10, the stops 161 at one side of the base 12 are inserted into corresponding slots 212 of one side of the heat sink 20. The handles 163 at the opposite side of the base 12 are pulled outwardly, causing the corresponding tabs 16 to move resiliently outwardly. The fan holder 10 is rotated down slightly so that the stops 161 of said corresponding tabs 16 are snappingly received in corresponding slots 212 of the opposite side of the heat sink 20. The flanges 18 thus fittingly receive top portions of the blocking plates 21 and the fins 23 therebetween. The tabs 16 resiliently abut the blocking plates 21. The fan 30 is placed on the fan holder 10. The screws 40 are received through the through holes 32 of the fan 30 and engaged in the screw holes 121 of the fan holder 10. The fan 30 is thus securely mounted on the heat sink 20.

To detach the fan holder 10 from the heat sink 20, the handles 163 at one side of the base 12 are pulled outwardly, causing the corresponding tabs 16 to move resiliently outwardly. The corresponding stops 161 exit the corresponding slots 212. The fan holder 10 is rotated up slightly. The stops 161 at the opposite side of the base 12 are then easily removed from the corresponding slots 212.

Figure 4:
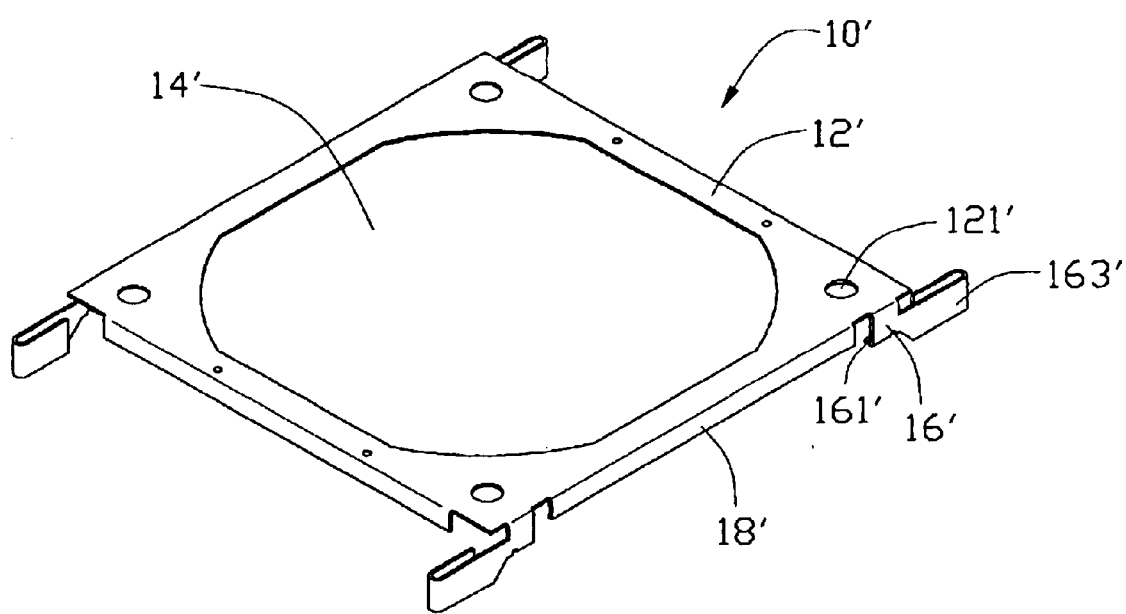
FIG. 4 is an isometric view of a fan holder in accordance with an alternative embodiment of the present invention.

FIG. 4 shows a fan holder 10' in accordance with an alternative embodiment of the present invention. The fan holder 10' is similar to the fan holder 10 of the preferred embodiment. However, in the fan holder 10', a stop 161' inwardly extends from a bottom edge of each tab 16', the stop 161' being orthogonal to the tab 16' and parallel to the base 12'. Further detailed description of the fan holder 10' is omitted herefrom; and reference is made to the above detailed description of the fan holder 10, with due alteration of details.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A fan holder for mounting a fan to a heat sink the fan holder comprising:

a base adapted to be attached to the heat sink and support the fan thereon, the base defining an opening in a middle thereof;

a pair of tabs bent from opposite sides of the base in a first direction, each of the tabs having a stop engaging with the heat sink; and a handle extending from each of the tabs for actuating the tab to move resiliently.

2. The fan holder of claim 1, wherein the first direction is substantially perpendicular to the base.

3. The fan holder of claim 2, wherein each handle extends generally coplanarly from its corresponding tab in a second direction.

4. The fan holder of claim 3, wherein the second direction is substantially perpendicular to the first direction.

5. The fan holder of claim 4, wherein each of the stops is substantially perpendicular to both its tab and the base, and is disposed at a side of said tab distal from the handle thereof.

6. The fan holder of claim 4, wherein each of the stops is substantially perpendicular to its tab, and substantially parallel to the base.

7. The fan holder of claim 1, wherein the base is rectangular.

8. The fan holder of claim 7, wherein four holes are defined in four corners of the base, for insertion of fasteners therethrough.

9. The fan holder of claim 7, wherein four flanges depend from four edges of the base, for fittingly receiving a top portion of the heat sink therebetween.

10. The fan holder of claim 1, wherein the handle is bent so that it doubles back over itself, for facilitating manual operation of the corresponding tab.

11. A heat dissipation assembly comprising:

a heat sink comprising a pair of blocking plates at opposite sides thereof, each of the blocking plates defining an aperture therein;

a fan holder comprising a base and a pair of tabs abutting top portions of the blocking plates, each of the tabs forming a stop received in a corresponding aperture, a handle extending from one of the tabs; and a fan attached on the base of the fan holder and thereby secured to the heat sink;

wherein the handle is pulled so that the stop of said one of the tabs can be resiliently engaged in or disengaged from its corresponding aperture.

12. The heat dissipation assembly of claim 11, wherein the heat sink comprises a chassis, and the blocking plates extend upwardly from opposite sides of the chassis.

13. The heat dissipation assembly of claim 12, wherein a plurality of fins extends upwardly from the chassis between the blocking plates.

14. The heat dissipation assembly of claim 11, wherein each of the stops is perpendicular to its tab.

15. The heat dissipation assembly of claim 11, wherein the fan defines four through holes therein for insertion of four fasteners therethrough to secure the fan to the fan holder.

16. The heat dissipation assembly of claim 11, wherein four flanges depend from four edges of the base, the flanges fittingly receiving a top portion of the heat sink therebetween.

17. A heat dissipation assembly comprising:

a heat sink including a chassis with a pair of blocking plates extending upwardly at two opposite sides thereof and a plurality of parallel fins upwardly extending therefrom and parallel to and between said pair of blocking plates;

a fan holder attached on a top portion of the heat sink, said fan holder including a planar base with an opening and a plurality of locking stops latched to the pair of blocking plates;

a fan located above the fan holder; and a plurality of fastening devices located on corners of the fan and fastened to aligned corners of the base of the fan holder; wherein some portions of the fins are removed to leave spaces around corners of the heat sink to allow operation and occupation of said fastening devices in the heat sink.

18. The assembly of claim 17, wherein said spaces are exposed to an exterior in a direction parallel to said fins.

19. The assembly of claim 17, wherein said stops are latched to upper portions of the blocking plates.

20. The assembly of claim 17, further including handles, for actuating the corresponding stops, around said corners of the base of the fan holder wherein said handles extend along the direction parallel to said fins.

* * * * *